United States Patent
Kobayashi et al.

(10) Patent No.: US 9,006,103 B2
(45) Date of Patent: Apr. 14, 2015

(54) METHOD OF MANUFACTURING WIRING SUBSTRATE

(71) Applicant: Shinko Electric Industries Co., Ltd., Nagano-shi, Nagano (JP)

(72) Inventors: Kazuhiro Kobayashi, Nagano (JP); Kotaro Kodani, Nagano (JP); Junichi Nakamura, Nagano (JP); Kentaro Kaneko, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 14/027,648

(22) Filed: Sep. 16, 2013

(65) Prior Publication Data
US 2014/0087556 A1   Mar. 27, 2014

(30) Foreign Application Priority Data
Sep. 24, 2012   (JP) .................... 2012-209398

(51) Int. Cl.
*H01L 21/44* (2006.01)
*H01L 21/66* (2006.01)
*H01L 21/768* (2006.01)
*H05K 3/00* (2006.01)

(52) U.S. Cl.
CPC ............ *H01L 21/76898* (2013.01); *H05K 3/00* (2013.01)

(58) Field of Classification Search
CPC ............... H01L 2224/279; H01L 2224/27901; H01L 2224/3221
USPC .................. 438/622, 624, 637–640, 666–668
See application file for complete search history.

(56) References Cited

FOREIGN PATENT DOCUMENTS

| JP | 2008-300482 A1 | 12/2008 |
|---|---|---|
| JP | 2009-88429 A1 | 4/2009 |
| JP | 2011-199077 A1 | 10/2011 |

*Primary Examiner* — Thanhha Pham
(74) *Attorney, Agent, or Firm* — Kratz, Quintos & Hanson, LLP (57) ABSTRACT

A method of manufacturing a wiring substrate, includes, forming an etching stop layer and a first wiring layer on a supporting member, forming a first insulating layer on the first wiring layer, forming a via hole reaching the first wiring layer, and forming the wiring layers of an n-layer and the insulating layers of an n-layer, removing the supporting member and the etching stop layer, thereby forming a build-up intermediate body, forming a second insulating layer on the wiring layer of an n-th layer, and forming a third insulating layer on first wiring layer, forming a via hole reaching the wiring layer of the n-th layer, and forming a via hole reaching the first wiring layer, forming a roughened face to the third insulating layer, and forming a second wiring layer connected to the wiring layer, and forming a third wiring layer connected to the first wiring layer.

9 Claims, 13 Drawing Sheets

METHOD OF MANUFACTURING WIRING SUBSTRATE

CROSS-REFERENCE TO RELATED APPLICATIONS

This application is based upon and claims the benefit of priority of the prior Japanese Patent Application No. 2012-209398, filed on Sep. 24, 2012, the entire contents of which are incorporated herein by reference.

FIELD

This invention is related to a method of manufacturing a wiring substrate.

BACKGROUND

In the prior art, there are wiring substrates for mounting electronic components such as semiconductor chips. As such wiring substrates, there are coreless type wiring substrates having no core substrate. The coreless type wiring substrates are manufactured on the basis of forming desired build-up wiring layer on a supporting member and then removing the supporting member. A related art is disclosed in Japanese Laid-open Patent Publication No. 2008-300482, Japanese Laid-open Patent Publication No. 2009-88429, and Japanese Laid-open Patent Publication No. 2011-199077.

SUMMARY

As explained in the column of preliminary matter described later, in the method of manufacturing the coreless type wiring substrate, the lowermost resin layer in build-up wiring layer formed on a supporting member has a longer heating history than the other resin layers and is therefore firmly cured.

Therefore, after the supporting member is removed and then via holes are formed in the lowermost resin layer, when the surface of the lowermost resin layer is subjected to a desmear process and is roughened, an adequately roughened face cannot be obtained. For this reason, there is such a problem that when the wiring layer is formed on the exposed face of the lowermost resin layer, the sufficient adhesion of the wiring layer cannot be obtained.

Also, there is a method that build-up wiring layer in which a copper foil and a metal plating layer are formed respectively on the lowermost and uppermost layers is separated from a supporting member, and then the copper foil and the metal plating layer on both sides are patterned by a subtractive method. In this method, wet etching is performed to a thick copper foil and a thick metal plating layer. Thus, it is difficult to form fine wiring layers on both sides.

According to one aspect discussed herein, there is provided a method of manufacturing a wiring substrate, including forming an etching stop layer on a supporting member, forming a first wiring layer on the etching stop layer, forming a first insulating layer so as to cover the etching stop layer and the first wiring layer, forming a via hole reaching the first wiring layer in the first insulating layer, and forming a wiring layer connected to the first wiring layer through the via hole on the first insulating layer, forming an insulating layer on the first insulating layer so as to cover the wiring layer, forming the wiring layers of an n-layer and the insulating layers of an n-layer (n is an integer of 2 or more) in which an n-th wiring layer is arranged uppermost by repeating the forming the wiring layer and the insulating layer, removing the supporting member so as to expose the etching stop layer, removing the etching stop layer so as to expose the first wiring layer, forming a build-up intermediate body constructed by the first wiring layer, the first insulating layer, the wiring layers of the p-layer and the insulating layers of the n-layer, by removing the etching stop layer, forming a second insulating layer on the insulating layer of an n-th layer so as to cover the wiring layer of the n-th layer, and forming a third insulating layer on the first insulating layer so as to cover the first wiring layer which is exposed from the first insulating layer, forming a via hole reaching the wiring layer of the n-th layer in the second insulating layer, and forming a via hole reaching the first wiring layer in the third insulating layer, forming a roughened face to the second insulating layer and the third insulating layer, and forming a second wiring layer connected to the wiring layer of the n-th layer through the via hole in the second insulating layer, and forming a third wiring layer connected to the first wiring layer through the via hole in the third insulating layer.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, preferred embodiments of the present invention will be explained with reference to the accompanying drawings.

Figure 1A:
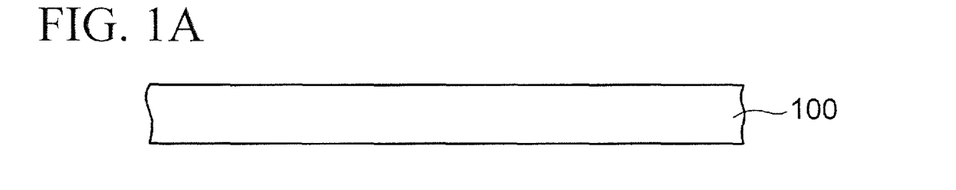
FIGS. 1A to 1E are cross-sectional views depicting a method of manufacturing a wiring substrate according to a preliminary matter (Part 1).
Figure 1B:
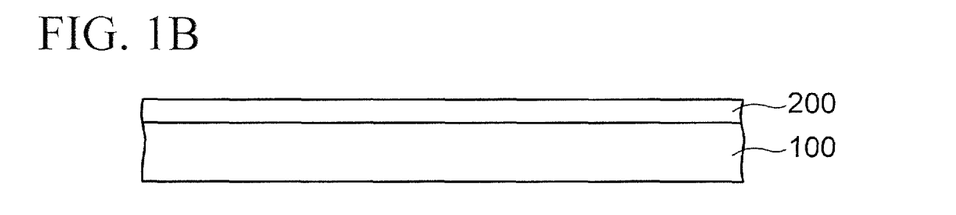

Prior to the explanation of an embodiment, the preliminary matter to be set forth as a basis will be explained hereunder. In the case of a method of manufacturing a coreless type wiring substrate, as depicted in FIG. 1A, first, a supporting member 100 such as a copper plate is prepared. Then, as depicted in FIG. 1B, a semi-cured resin film is attached to the supporting member 100 and heated at a temperature of around 190° C. to cure the resin film, so that a resin layer 200 is obtained.

Figure 1C:
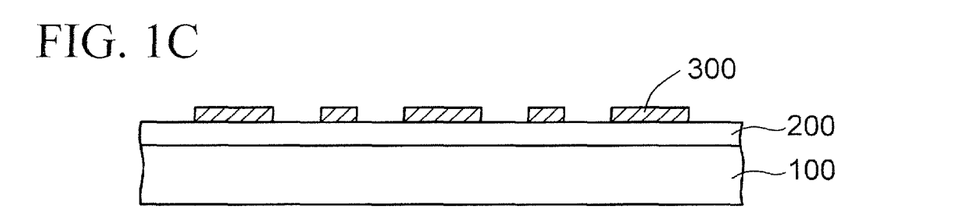
Figure 1D:
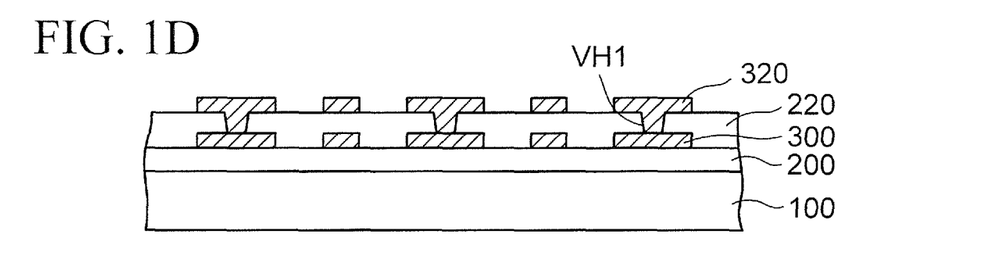

Then, as depicted in FIG. 1C, a wiring layer 300 is formed on the resin layer 200. Thereafter, as depicted in FIG. 1D, a resin layer 220 is formed on the resin layer 200 by a method similar to the method of forming the resin layer 200, the resin layer 220 covering the wiring layer 300. Further, the resin layer 220 is processed by a laser or the like to form via holes VH1 reaching the wiring layer 300.

Then, as depicted in FIG. 1D, similarly, a wiring layer 320 is formed on the resin layer 220, the wiring layer 320 being connected to the wiring layer 300 through the via holes VH1.

Figure 1E:
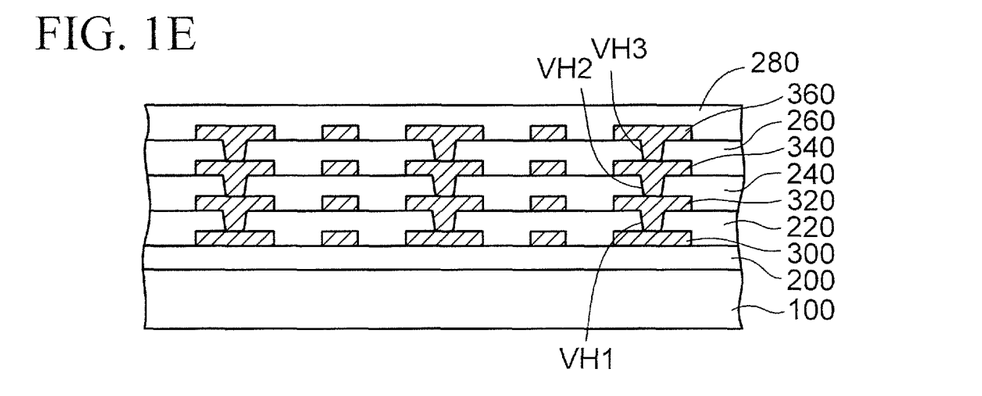

Thereafter, as depicted in FIG. 1E, similar steps are repeated to form a wiring layer 340 on a resin layer 240, the wiring layer 340 being connected to the wiring layer 320 through via holes VH2 provided in the resin layer 240.

Further, similar steps are repeated to form a wiring layer 360 on a resin layer 260, the wiring layer 360 being connected to the wiring layer 340 through via holes VH3 provided in the resin layer 260. Thereafter, a resin layer 280 is formed which covers the wiring layer 360.

In this way, the build-up wiring layer of the four layers is formed on the supporting member 100.

Figure 2A:
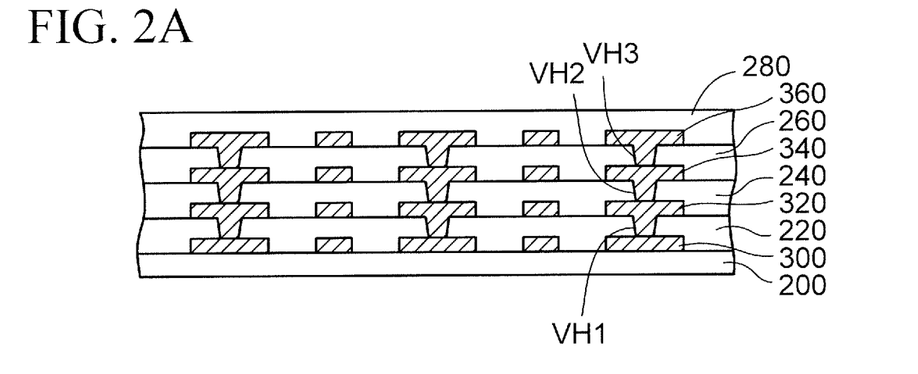
FIGS. 2A to 2C are cross-sectional views depicting the method of manufacturing a wiring substrate according to the preliminary matter (Part 2).

Then, as depicted in FIG. 2A, the supporting member 100 is removed by wet etching to expose the lower face of the resin layer 200.

Figure 2B:
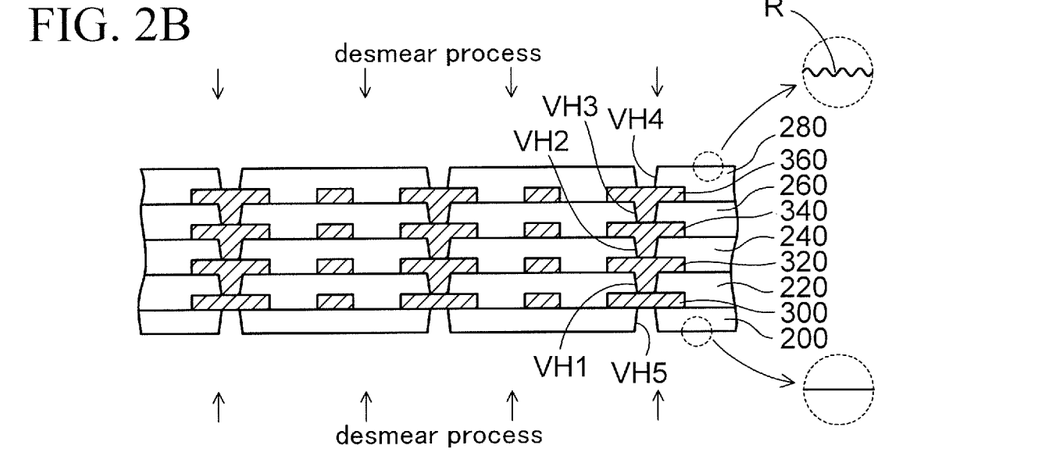

Thereafter, as depicted in FIG. 2B, the resin layer 280 is processed by a laser or the like to form via holes VH4 reaching the wiring layer 360. Further, the resin layer 200 is processed by a laser or the like to form via holes VH5 reaching the lower face of the wiring layer 300.

Then, as depicted in FIG. 2B, similarly, on both face sides, a desmear process using a potassium permanganate solution or the like is performed in the via holes VH4 and the via holes VH5. By this matter, resin smears remaining on the bottoms of the via holes VH4 and VH5 are cleaned.

In this time, simultaneously, the respective surfaces of the resin layer 200 and the resin layer 280 are etched by the desmear process.

Meanwhile, the resin layer 200 is repeatedly subjected to a heating process every time each of the resin layers 220, 240, 260, and 280 is formed. For this reason, the resin layer 200 has a longer heating history than the other resin layers and is therefore firmly cured.

Accordingly, as depicted in the partially enlarged cross-sectional views in FIG. 2B, when the desmear process is performed, the sufficient asperities are formed on the surface of the resin layer 280 by etching, thus the surface of the resin layer 280 is formed as a desired roughened face R, whereas the surface of the resin layer 200 is hard to etch and is therefore not roughened sufficiently.

Figure 2C:
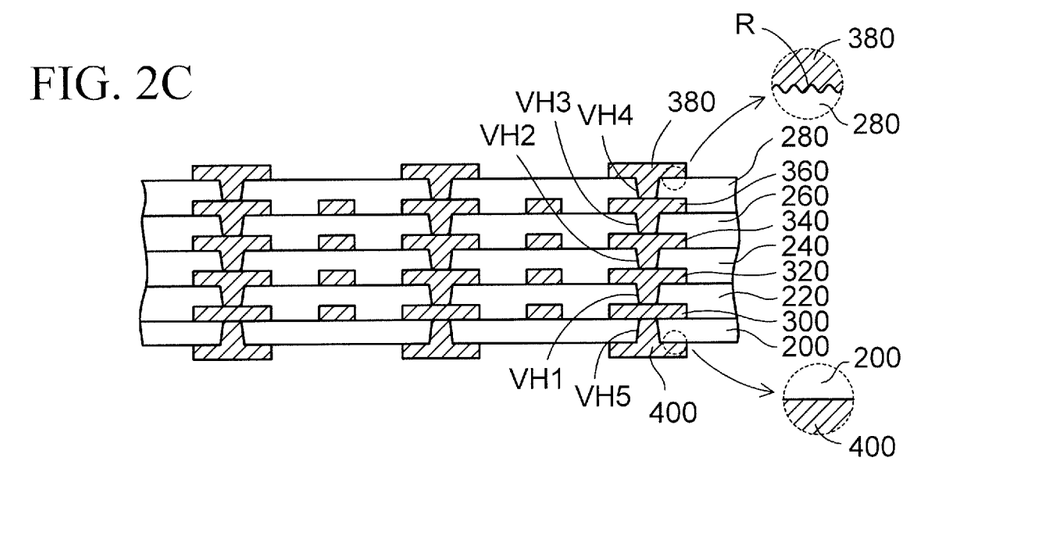

Then, as depicted in FIG. 2C, a wiring layer 380 is formed on the resin layer 280, the wiring layer 380 being connected to the wiring layer 360 through the via holes VH4. Since the surface of the resin layer 280 is an adequately roughened face R, the wiring layer 380 is formed on the resin layer 280 with good adhesion.

Moreover, as depicted in FIG. 2C, similarly, a wiring layer 400 is formed on the lower face of the resin layer 200, the wiring layer 400 being connected to the wiring layer 300 through the via holes VH5. Since the lower face of the resin layer 200 is not sufficiently roughened, there is a problem that the sufficient adhesion cannot be obtained between the wiring layer 400 and the resin layer 200.

In the case that the wiring layer 400 is formed by a semi-additive method, when a seed layer is formed by electroless plating, the seed layer is detached from the resin layer 200, thus a bulge is easy to occur.

For this reason, when the wiring layer 400 is formed on the lower face of the resin layer 200, the device that the line width is thickened, or the like is needed for the detachment countermeasure. Therefore, it becomes difficult to form the wiring layer 400 with the same design rule as those of the wiring layers formed on the other resin layers, and a limitation on the design is caused.

Moreover, though not depicted herein, as another method of manufacturing a coreless type wiring substrate, there is a method in which build-up wiring layer is formed on a supporting member through the copper foil with a peelable state in a similar way. In this method, the build-up wiring layer including the copper foil is separated from the supporting member, and then the lowermost copper foil and the uppermost copper plating layer are patterned by a subtractive method to form wiring layers.

Accordingly, the wiring layers are formed by performing the wet-etching to a thick copper foil and a thick copper plating layer. Therefore, it is difficult to form fine wiring layers on both face sides.

The embodiments to be described below can solve the problems mentioned above.

First Embodiment

FIGS. 3A to 8B are cross-sectional views depicting a method of manufacturing a wiring substrate of a first embodiment.

Figure 3A:
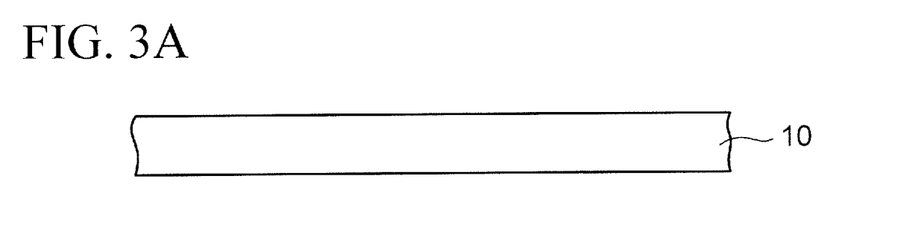
FIGS. 3A to 3E are cross-sectional views depicting a method of manufacturing a wiring substrate of a first embodiment (Part 1).

In the method of manufacturing a wiring substrate of the first embodiment, as depicted in FIG. 3A, first, a supporting member 10 is prepared. The supporting member 10 is formed of a metal plate, for example, and is formed of a copper plate or a copper foil whose thickness is 150 µm to 500 µm as one example.

Figure 3B:
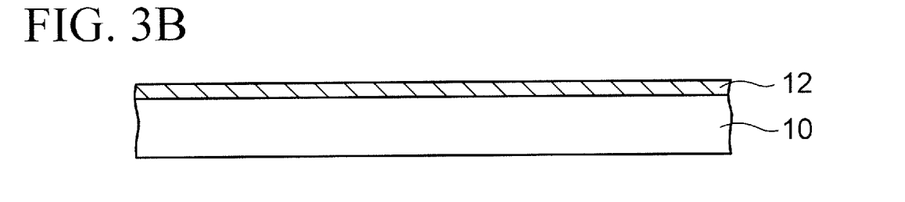

Then, as depicted in FIG. 3B, a nickel (Ni) layer whose thickness is about 2 µm is formed on the entire surface of the supporting member 10 by electroplating utilizing the supporting member 10 as a plating power feeding path, thus an etching stop layer 12 is obtained. Alternatively, the etching stop layer 12 may be obtained by forming a nickel layer on the supporting member 10 by electroless plating.

The etching stop layer 12 is formed of a metal which serves as a stopper when the supporting member 10 is removed by wet etching. Also, in addition, the etching stop layer 12 is formed of a metal which can be etched by an etching solution that does not corrode wiring layers when removing the etching stop layer 12 itself by wet etching.

In the case that the supporting member 10 and the wiring layers are formed of copper, the nickel layer is preferable as the etching stop layer 12. However, it is possible to use a gold (Au) layer, a tin (Sn) layer, or the like as the etching stop layer 12.

Figure 3C:
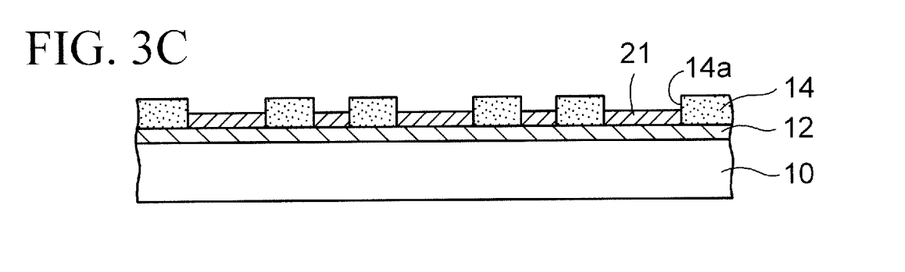

Thereafter, as depicted in FIG. 3C, a plating resist 14 in which opening portions 14a are provided is formed on the etching stop layer 12 by photolithography. Further, a wiring layer 21 whose thickness is about 20 μm and made of copper or the like is formed by electroplating utilizing the etching stop layer 12 as a plating power feeding path.

Figure 3D:
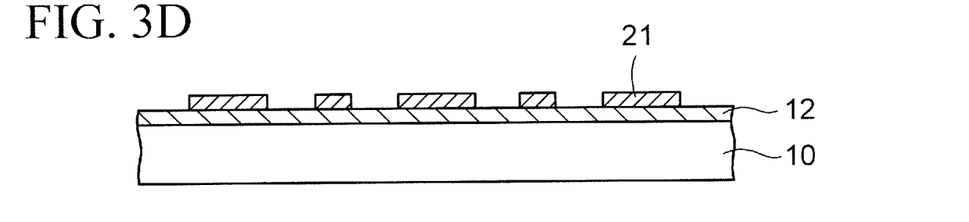

Then, as depicted in FIG. 3D, the plating resist 14 is removed.

The wiring layer 21 may be a lead-out wiring having a connection pad at one end, or a connection pad arranged like an island shape. The same applies to the other wiring layers.

In this way, the wiring layer 21 is formed on the supporting member 10 through the etching stop layer 12.

Figure 3E:
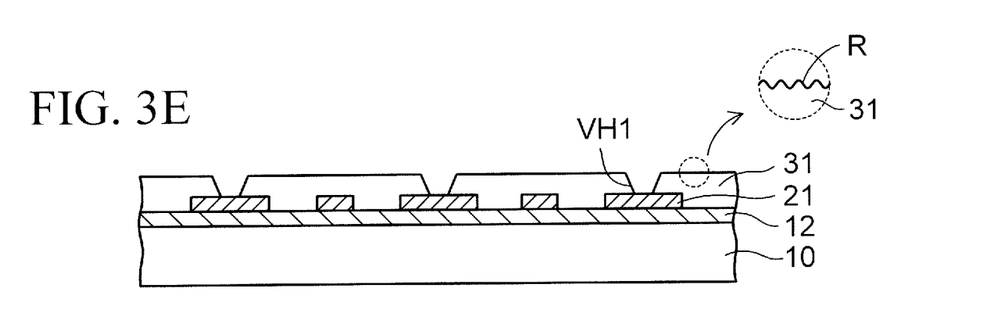

Thereafter, as depicted in FIG. 3E, a semi-cured resin film is attached to the etching stop layer 12 and the wiring layer 21, and a heating process is performed at a temperature of about 190° C. to cure the resin film. By this matter, a resin layer 31 whose thickness is about 30 μm is obtained. As the resin film, a thermosetting epoxy resin, a thermosetting polyimide resin, or the like is used.

The resin layer 31 is formed as an interlayer insulating layer. The same applies to the other resin layers to be described later.

Further, the resin layer 31 is processed by a laser or the like to form via holes VH1 reaching the wiring layer 21. The diameter of each via hole VH1 is set to 60 μm to 70 μm, for example.

The via hole VH1 is formed from the upper face side of the resin layer 31 by the laser, or the like. Therefore, each via hole VH1 is formed to have a forward tapered shape whose diameter is set small gradually from the surface of the resin layer 31 toward the thickness direction thereof.

Thereafter, a desmear process using a potassium permanganate solution or the like is performed to the inside of the via holes VH1. By this matter, the resin smears remaining on the bottoms of the via holes VH1 are cleaned. In this time, simultaneously, as depicted in the partially enlarged cross-sectional view in FIG. 3E, by the desmear process, the asperities are formed on the side face of each via hole VH1 and the surface of the resin layer 31, thus the surface of the resin layer 31 is made to a roughened face R.

The surface roughness of the roughened face R of the resin layer 31 is set to 500 nm or less and preferably to 100 nm to 400 nm. The surface roughness of the other resin layers is set within the same range as the resin layer 31.

Although a permanganate method is illustrated as the method for the desmear process, plasma etching, blasting, or the like may be used. In the case that the plasma etching is used, the desmear process is performed by using a dry etching equipment using a mixed gas in which $O_2$, $N_2$, or the like is mixed to $CF_4$, for example.

Figure 4A:
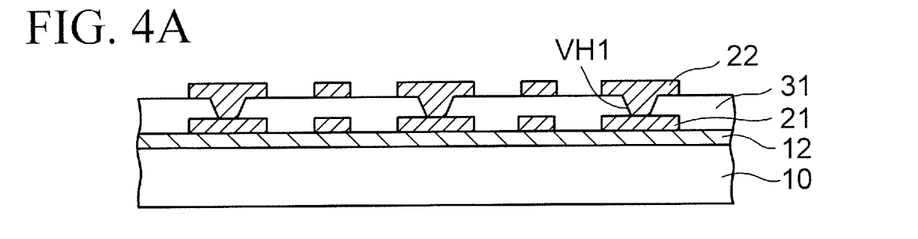
FIGS. 4A to 4C are cross-sectional views depicting the method of manufacturing a wiring substrate of the first embodiment (Part 2).

Then, as depicted in FIG. 4A, a wiring layer 22 is formed on the resin layer 31, the wiring layer 22 being connected to the wiring layer 21 through the via holes VH1. Since the surface of the resin layer 31 is adequately roughened, the wiring layer 22 is formed on the resin layer 31 with good adhesion by the anchor effect.

Figure 5A:
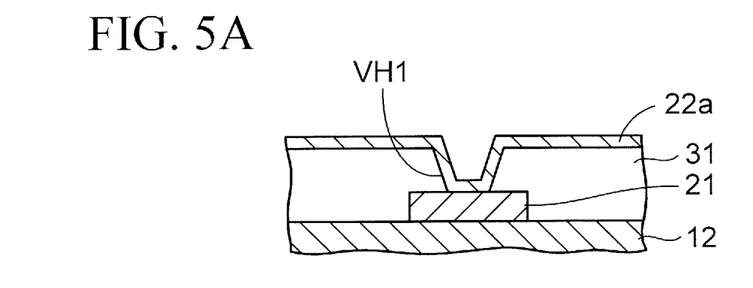
FIGS. 5A to 5D are cross-sectional views depicting a method of forming a second wiring layer in FIG. 4A.

The wiring layer 22 is formed by a semi-additive method, for example. Explaining in more detail, as depicted in FIG. 5A, first, a seed layer 22a made of copper or the like is formed on the resin layer 31 and on the inner face of each via hole VH1 by electroless plating or sputtering.

Figure 5B:
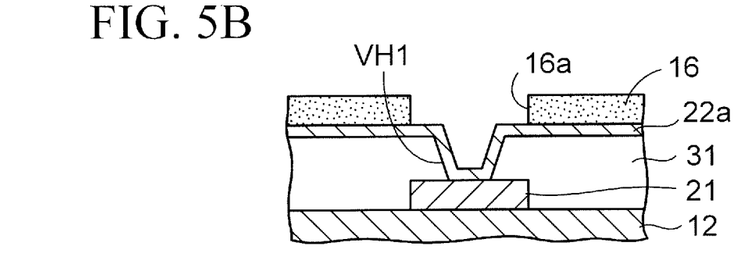

Further, as depicted in FIG. 5B, a plating resist 16 is formed on the seed layer 22a on the basis of the photolithography, the plating resist 16 having opening portions 16a provided on parts where the wiring layer 22 is arranged.

Figure 5C:
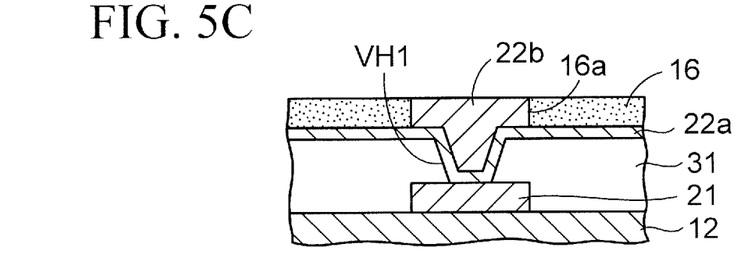

Then, as depicted in FIG. 5C, a metal plating layer 22b made of copper or the like is formed in the region from the inside of the via holes VH1 to the opening portions 16a of the plating resist 16 by electroplating utilizing the seed layer 22a as a plating power feeding path.

Figure 5D:
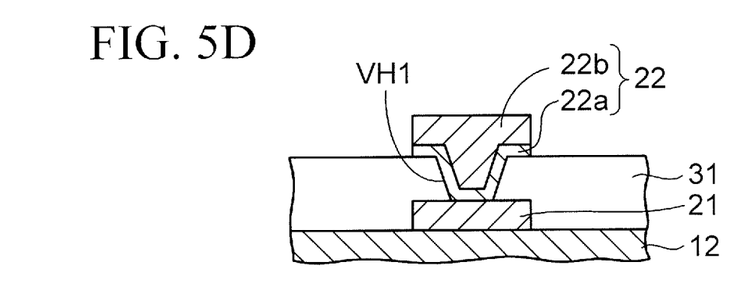

Then, as depicted in FIG. 5D, the plating resist 16 is removed, and thereafter the seed layer 22a is etched and removed while using the metal plating layer 22b as a mask. By this matter, the wiring layer formed of the seed layer 22a and the metal plating layer 22b is obtained. The wiring layer 22 is formed to include a via conductor filled in the via hole VH1.

It is preferable to form the other wiring layers by a semi-additive method. However, in the case that fine wirings are not needed, a different wiring forming method such as a subtractive method or a full-additive method may be used.

Then, referring back to FIG. 4B to resume the description, similar steps are repeated to form a wiring layer 23 on a resin layer 32, the wiring layer 23 being connected to the wiring layer 22 through via holes VH2 formed in the resin layer 32.

Figure 4B:
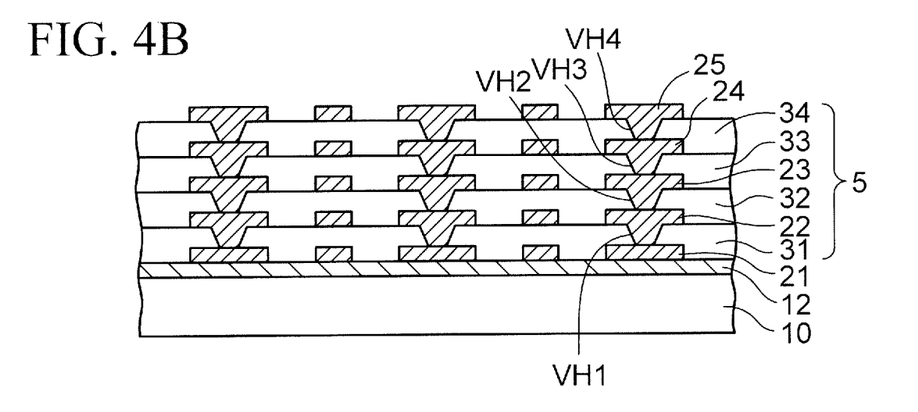

Further, similar steps are repeated to form a wiring layer 24 on a resin layer 33, the wiring layer 24 being connected to the wiring layer 23 through via holes VH3 formed in the resin layer 33.

Furthermore, similar steps are repeated to form a wiring layer 25 on a resin layer 34, the wiring layer 25 being connected to the wiring layer 24 through via holes VH4 formed in the resin layer 34.

In this way, a build-up intermediate body 5 of five layers is formed on the supporting member 10 through the etching stop layer 12.

Figure 4C:
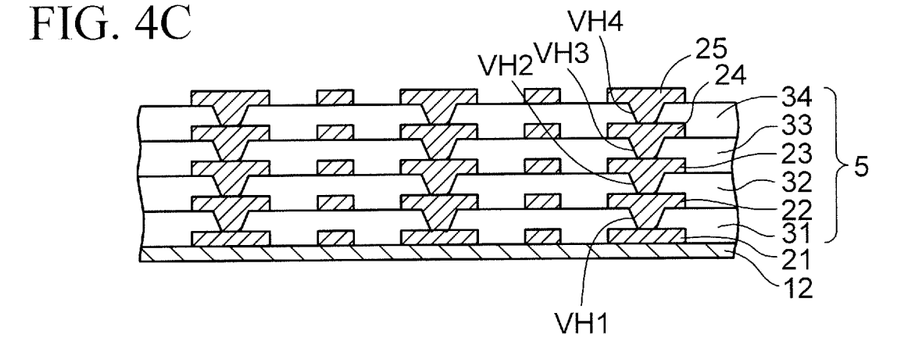

Thereafter, as depicted in FIG. 4C, the supporting member 10 is removed by wet etching. In the case that the supporting member 10 is formed of copper, an alkaline etching solution mainly containing ammonia, or the like is used as the etching solution. The etching stop layer 12 (nickel) is hardly etched by the alkaline etching solution, and thus the etching stop layer 12 functions as a stopper, the etching is stopped.

In this way, the supporting member 10 can be selectively removed to the etching stop layer 12.

Figure 6A:
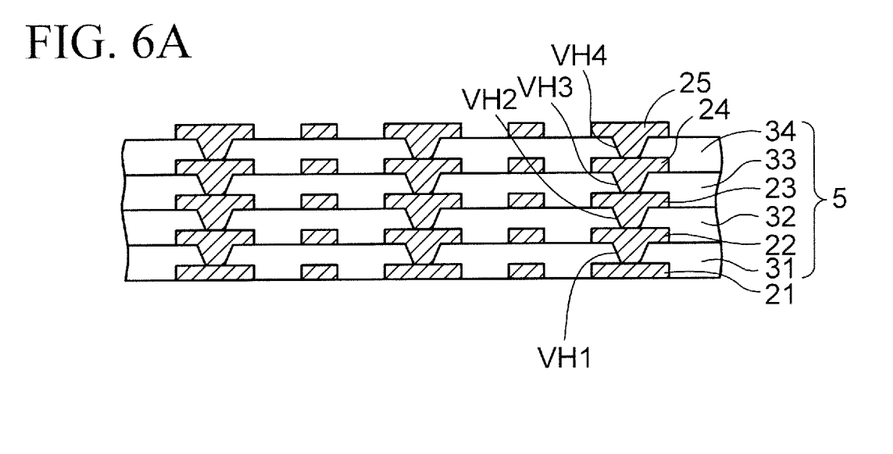
FIGS. 6A and 6B are cross-sectional views depicting the method of manufacturing a wiring substrate of the first embodiment (Part 3).

Further, as depicted in FIG. 6A, the etching stop layer 12 is removed by wet etching. In the case that the etching stop layer 12 is formed of nickel, a mixed solution of aqueous hydrogen peroxide and nitric acid, or the like is used as the etching solution. By this matter, the etching stop layer 12 (nickel) can be selectively removed to the wiring layer 21 (copper) and the resin layer 31.

By the above steps, the supporting member 10 and the etching stop layer 12 are removed from the structure in FIG. 4B, so that the build-up intermediate body 5 of five layers is obtained.

Although the mode described above illustrates the build-up intermediate body 5 including the multi-layer wiring layers of the five layers, a build-up intermediate body of n layers (n is an integer of 2 or more) can be formed in accordance with the various modes.

In this embodiment, the wiring layer 21 is formed directly on the etching stop layer 12 located on the supporting member 10, and thereafter the resin layer 31 is formed. For this reason, when the supporting member 10 and the etching stop layer 12 are removed, the wiring layer 21 and the resin layer 31 of the build-up intermediate body 5 are exposed. The lower face of the wiring layer 21 and the lower face of the resin layer 31 are arranged to constitute the same surface.

Figure 6B:
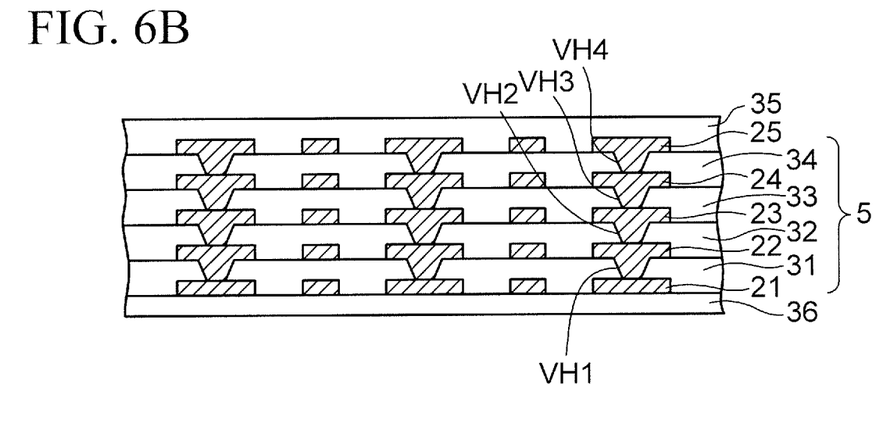

Then, as depicted in FIG. 6B, semi-cured resin films are attached respectively to both face sides of the build-up intermediate body 5 in FIG. 6A and heated at a temperature of about 190° C. to cure the resin films. By this matter, a resin layer 35 covering the wiring layer 25 is obtained on the resin layer 34. Moreover, a resin layer 36 covering the wiring layer 21 is obtained on the resin layer 31.

As described above, in this embodiment, unlike the manufacturing of the preliminary matter, the exposed face of the resin layer 31 that is subject to excessive heating process and has the property in which the formation of the roughened face is difficult, is not utilized as a wiring forming surface. Thus, there is no need to consider the problem in which the lower face of the resin layer 21 is hard to be roughened.

Figure 7A:
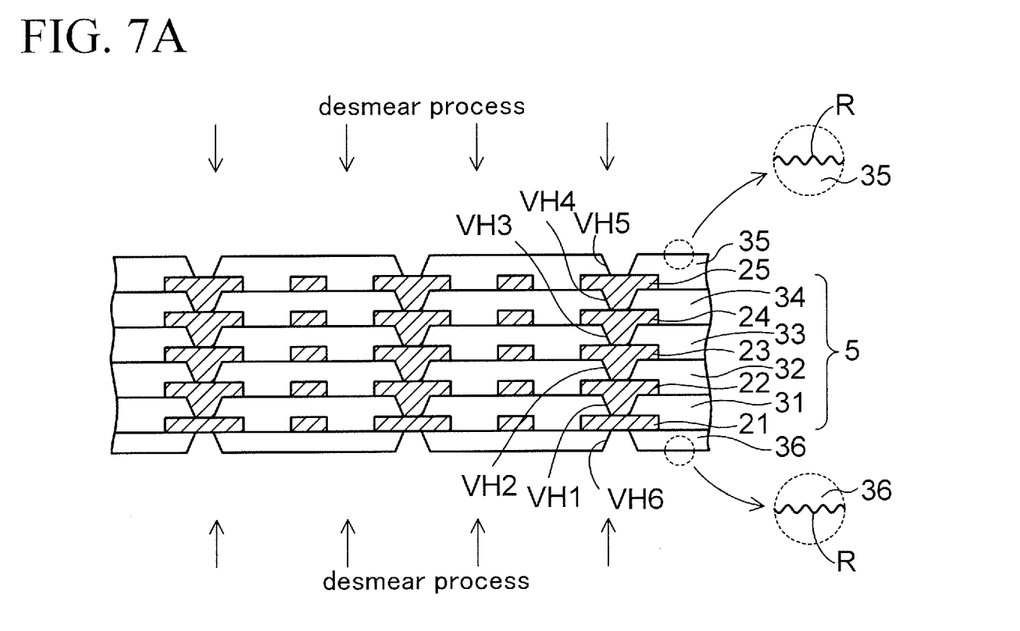
FIGS. 7A and 7B are cross-sectional views depicting the method of manufacturing a wiring substrate of the first embodiment (Part 4).

Then, as depicted in FIG. 7A, the resin layer 35 on the upper face side is processed by a laser, or the like to form via holes VH5 reaching the wiring layer 25. Further, similarly, the resin layer 36 on the lower face side is processed by a laser, or the like to form via holes VH6 reaching the wiring layer 21.

Furthermore, as depicted in FIG. 7A, similarly, desmear process using a potassium permanganate solution, or the like is performed. By this matter, the resin smears remaining on the bottoms of the via holes VH5 and VH6 are cleaned.

In this time, simultaneously, as depicted in the partially enlarged cross-sectional views in FIG. 7A, by the desmear process, the asperities are formed on the side face of each via hole VH5, VH6 and the each surface of the resin layer 35 and resin layer 36, thus, the each surface of the resin layer 35 and the resin layer 36 is made to a roughened face R.

As described above, the resin layer 36 is additionally formed on the exposed faces of the wiring layer 21 and the resin layer 31, and the surface of the resin layer 36 is roughened. By this matter, a good wiring forming surface can be obtained.

Then, the resin layer 36 having the roughened face R is easily formed on also the surface of the build-up intermediate body 5 on the side from which the supporting member 10 and the etching stop layer 12 are removed.

The surface roughness of the roughened face R of the resin layer 36 is set to 500 nm or less and preferably to 100 nm to 400 nm and is set within the same range as that of the surface roughness of the other resin layers 31 to 35.

By this matter, in all the resin layers on which the respective wiring layers of the build-up wiring layer are formed, their surface roughness can be set within the same range.

Figure 7B:
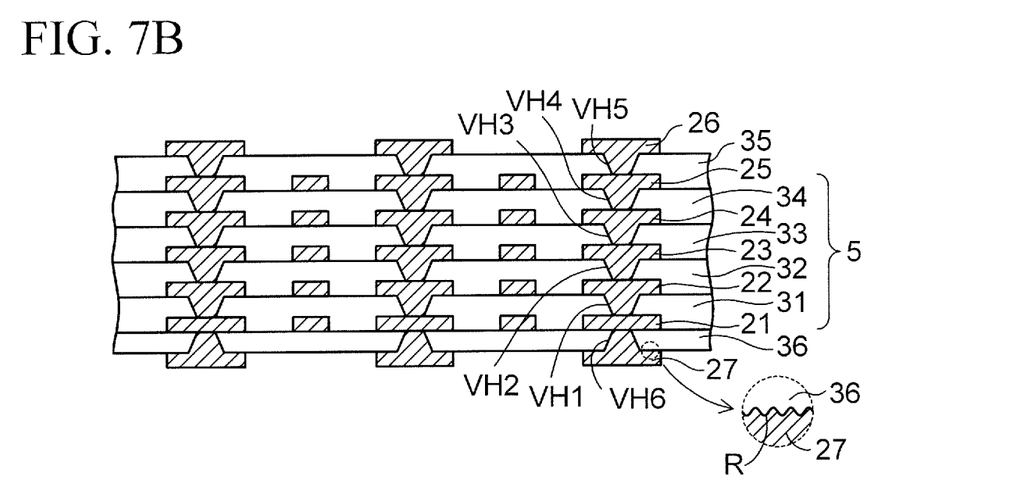

Then, as depicted in FIG. 7B, on the upper face side of the structure in FIG. 7A, a wiring layer 26 is formed on the resin layer 35, the wiring layer 26 being connected to the wiring layer 25 through the via holes VH5.

Further, similarly, on the lower face side of the structure in FIG. 7A, a wiring layer 27 is formed on the resin layer 36, the wiring layer 27 being connected to the wiring layer 21 through the via holes VH6.

Each via hole VH6 is formed from the lower face side of the resin layer 36 by a laser, or the like. Therefore, the via hole VH6 is formed to have a reverse tapered shape whose diameter is set small gradually from the lower face of the resin layer 36 toward the thickness direction thereof. The via hole VH6 is formed to have the tapered shape reverse to the shape of the via holes VH1-VH5.

As depicted in the partially enlarged cross-sectional view in FIG. 7B, since the surface of the resin layer 36 is the adequately roughened face R, the wiring layer 27 is formed on the resin layer 36 with good adhesion. Moreover, in the case that the wiring layer 27 is formed by a semi-additive method, the seed layer is hard to be detached from the resin layer 36 and the bulge does not occur. Thus, a fine wiring layer 27 can be formed at a good yield.

As described above, in this embodiment, all the resin layers on which wiring layers are formed are adequately roughened.

Therefore, in the wiring layers of all the layers, sufficient adhesion is secured. Accordingly, all the wiring layers of the build-up wiring layer can be formed with the same design rule, thereby the limitation on the design is not caused.

For example, the wiring layers in all the layers can be formed at narrow pitches of 10 μm to 30 μm with a good yield.

In this way, the fine wiring layer 27 can be formed with good adhesion on also the surface of the build-up intermediate body 5 on the side from which the supporting member 10 and the etching stop layer 12 are removed.

Figure 8A:
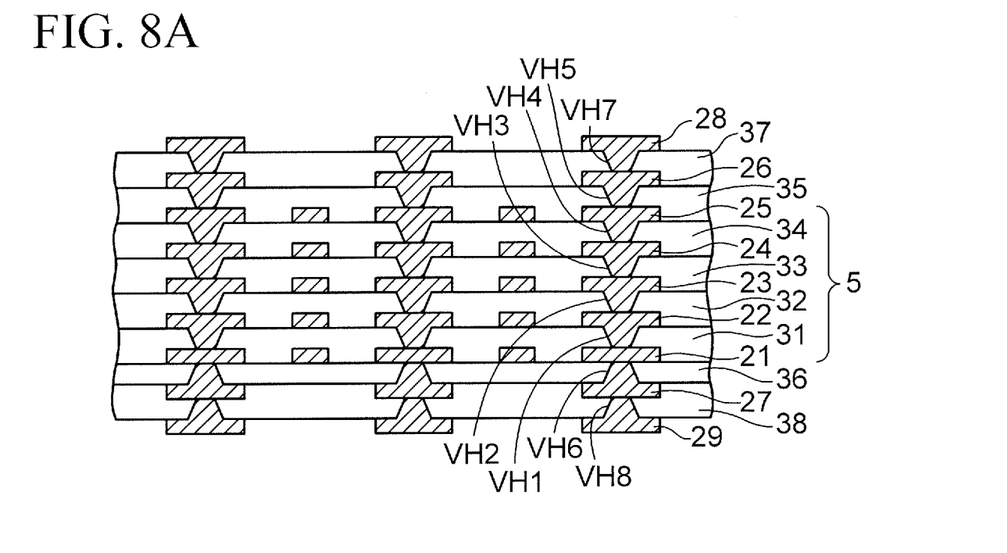
FIGS. 8A and 8B are cross-sectional views depicting the method of manufacturing a wiring substrate of the first embodiment (Part 5).

Then, as depicted in FIG. 8A, similar steps are repeated to form a wiring layer 28 on a resin layer 37 on the upper face side in FIG. 7B, the wiring layer 28 being connected to the wiring layer 26 through via holes VH7 formed in the resin layer 37.

Further, similar steps are repeated to form a wiring layer 29 on a resin layer 38 on the lower face side in FIG. 7B, the wiring layer 29 being connected to the wiring layer 27 through via holes VH8 formed in the resin layer 38.

Figure 8B:
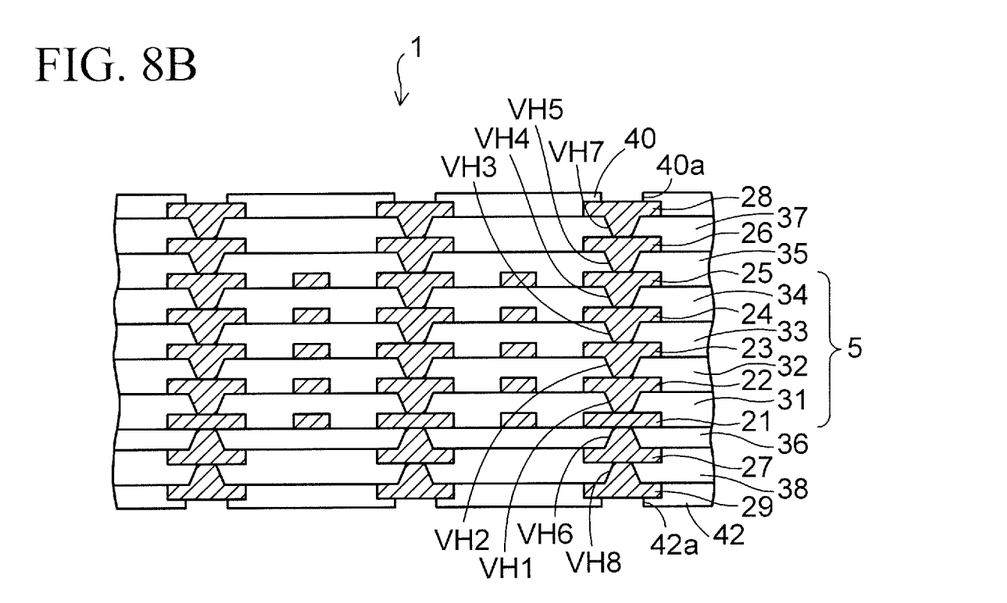

Then, as depicted in FIG. 8B, on the upper face side, the solder resist 40 in which opening portions 40a are provided on connection parts of the wiring layer 28 is formed. Moreover, on the lower face side, a solder resist 42 in which opening portions 42a are provided on connection parts of the wiring layer 29 is formed.

By the above steps, a wiring substrate 1 of the first embodiment is obtained. In this embodiment, the wiring layers of the two layers are stacked respectively on both face sides of the build-up intermediate body 5 of the five layers (FIG. 6B) from which the supporting member 10 and the etching stop layer 12 are removed. However, this mode is merely one example, and the number of wiring layers to be stacked can be set to arbitrary number.

Moreover, although an insulating resin is used as each interlayer insulating layer, it is possible to use a different insulating material.

As described above, in the method of manufacturing a wiring substrate of the first embodiment, first, the build-up intermediate body 5 in which the wiring layers 21 to 25 are stacked is formed on the supporting member 10 through the etching stop layer 12. Further, after the supporting member 10 and the etching stop layer 12 are removed, the wiring layers 26 and 28 are stacked on the wiring layer 25 on the upper face side while the wiring layers 27 and 29 are stacked on the exposed wiring layer 21 on the lower face side.

By this matter, the fine wiring layers can be formed with good adhesion on also the surface of the build-up intermediate body 5 on the side from which the supporting member 10 and the etching stop layer 12 are removed.

Since the wiring substrate 1 of the first embodiment is manufactured by the method described above, the via holes VH6 and VH8 in which the wiring layers 27 and 29 are arranged are formed to have the tapered shape reverse to the tapered shape of the other via holes.

Figure 9:
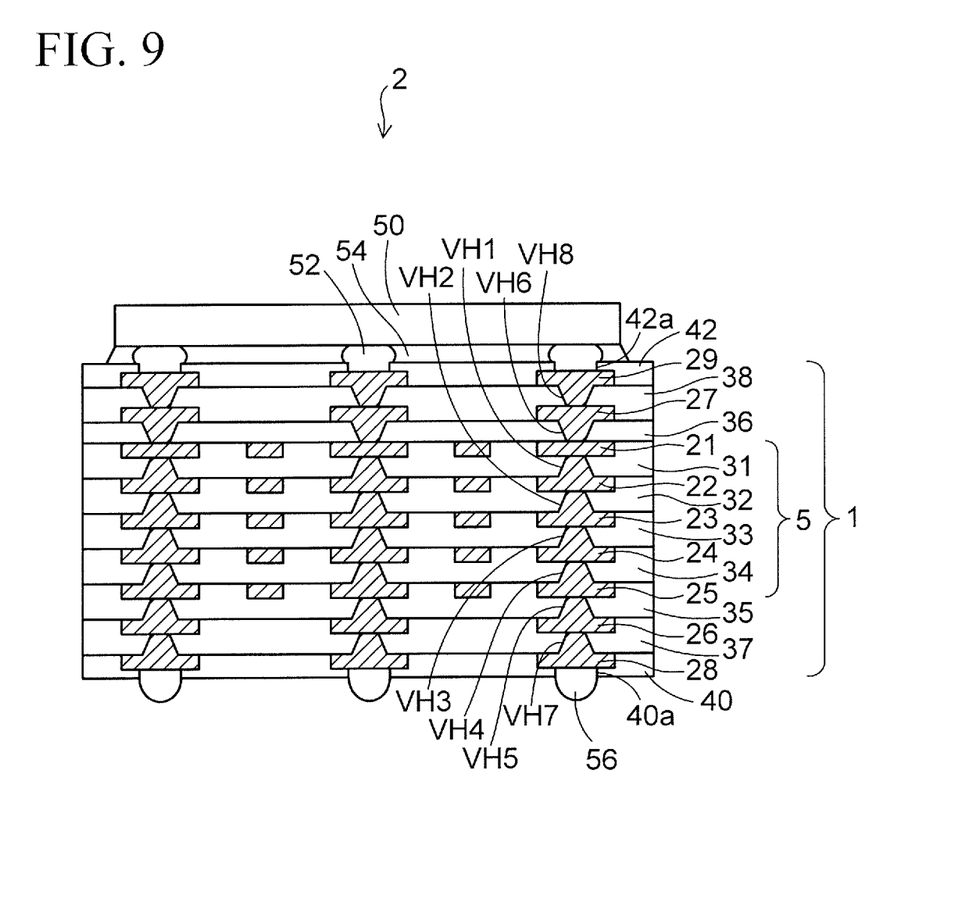
FIG. 9 is a cross-sectional depicting an example of a semiconductor device using the wiring substrate in FIG. 8B.

FIG. 9 depicts an example of a semiconductor device utilizing the wiring substrate 1 in FIG. 8B. As depicted in FIG. 9, in a semiconductor device 2, the wiring substrate 1 in FIG. 8B is reversed up and down, and a semiconductor chip 50 is flip-chip connected to the connection parts of the wiring layer 29 through bump electrodes 52.

Moreover, underfill resin 54 is filled in the gap between the semiconductor chip 50 and the wiring substrate 1. Further, external connection terminals 56 are provided on the connection parts of the wiring layer 28 located to the face opposed to the face on which the semiconductor chip 50 is mounted, by mounting solder balls, or the like.

Then, the external connection terminals 56 of the semiconductor device 2 are connected to a mounting substrate such as a motherboard.

By the wiring layers in the wiring substrate 1, the narrow pitch of the wiring layer 29 on the upper face side corresponding to the semiconductor chip 50 is converted so as to correspond to the wide pitch of the mounting substrate.

Alternatively, the reverse is possible, the semiconductor chip may be flip-chip connected to the connection parts of the wiring layer 28 on the upper face side of the wiring substrate 1 in FIG. 8B, and the external connection terminals may be provided on the wiring layer 29 on the opposite face side.

Second Embodiment

FIGS. 10A to 13B are cross-sectional views depicting a method of manufacturing a wiring substrate of a second embodiment.

In the first embodiment described above, the wiring layer is patterned on the etching stop layer (nickel layer) which is formed on the entire surface of the supporting member. However, in the second embodiment, the etching stop layer (nickel layer) is formed with the same pattern as the wiring layer.

Figure 10A:
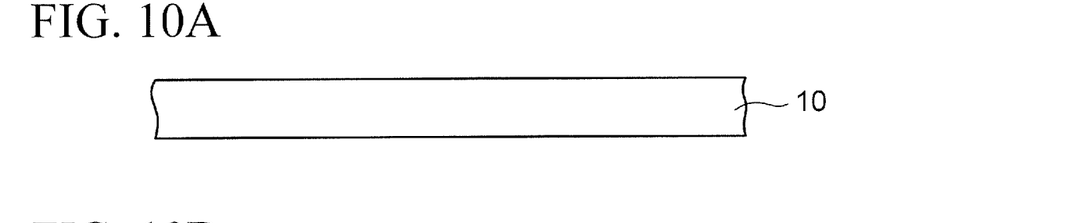
FIGS. 10A to 10E are cross-sectional views depicting a method of manufacturing a wiring substrate of a second embodiment (Part 1).
Figure 10B:
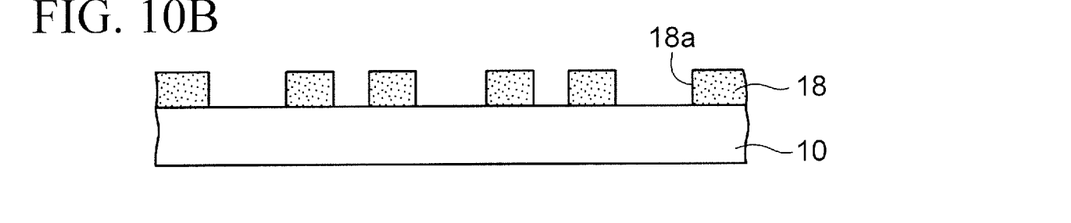

In the method of manufacturing a wiring substrate of the second embodiment, as depicted in FIG. 10A, like the first embodiment, first, a supporting member 10 is prepared. Then, as depicted in FIG. 10B, a plating resist 18 in which opening portions 18a are provided is patterned on the supporting member 10 on the basis of the photolithography.

Figure 10C:
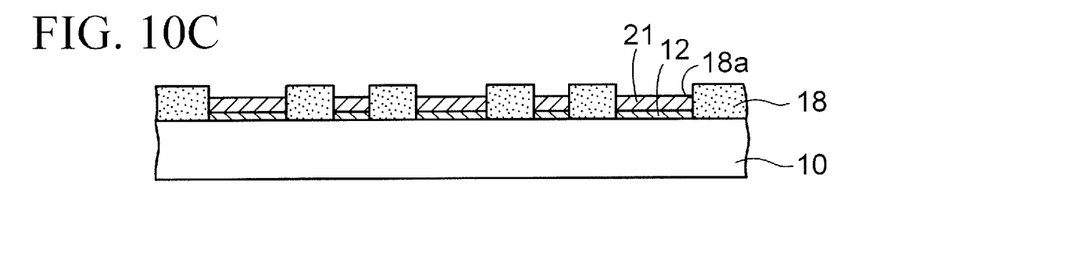

Thereafter, as depicted in FIG. 10C, an etching stop layer 12 made of nickel, or the like is formed on the supporting member 10 in the opening portions 18a of the plating resist 18 by electroplating utilizing the supporting member 10 as a plating power feeding path. Then, a wiring layer 21 made of copper, or the like is obtained on the etching stop layer 12 by similar electroplating.

Figure 10D:
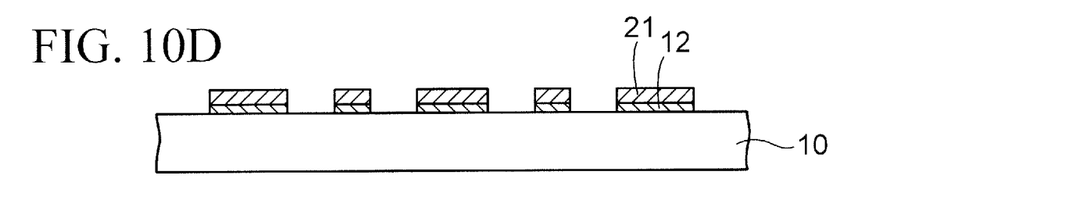

Alternatively, the etching stop layer 12 and the wiring layer 21 may be formed by electroless plating. Then, as depicted in FIG. 10D, the plating resist 18 is removed.

The pattern of the etching stop layer 12 and the wiring layer 21 may be a lead-out wiring having a connection pad at one end, or a connection pad arranged like an island shape.

Like the first embodiment, the etching stop layer 12 is formed as a stopper when etching and removing the supporting member 10.

In the second embodiment, the etching stop layer 12 is formed with the same pattern as the wiring layer 21.

Figure 10E:
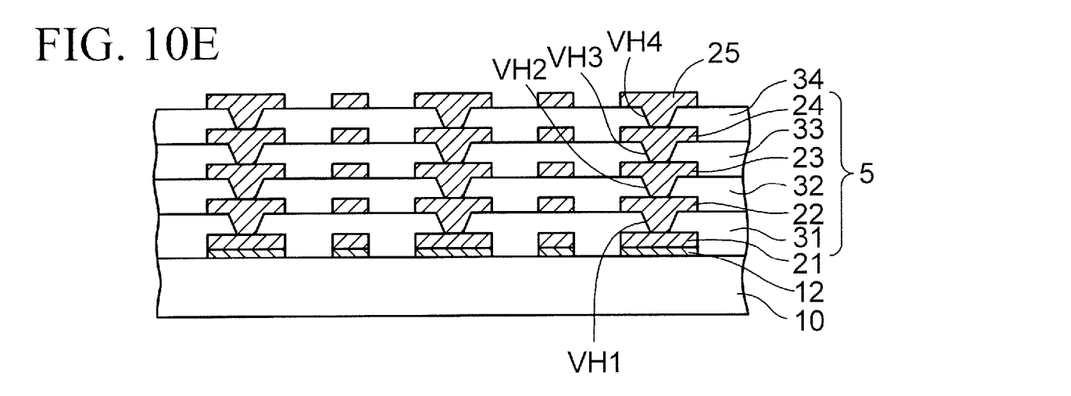

Then, as depicted in FIG. 10E, the same steps as those in FIGS. 3E to 4B of the first embodiment are performed to form the build-up intermediate body 5 of the five layers on the supporting member 10.

Figure 11A:
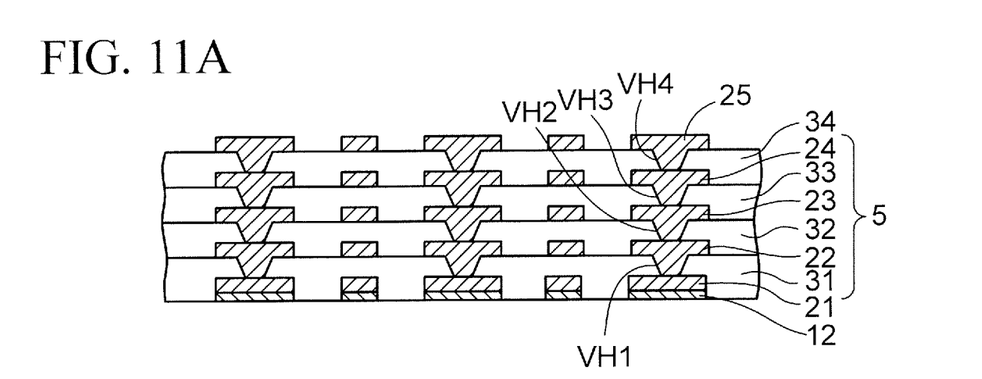
FIGS. 11A and 11B are cross-sectional views depicting the method of manufacturing a wiring substrate of the second embodiment (Part 2).

Thereafter, as depicted in FIG. 11A, the supporting member 10 is removed by wet etching. Like the first embodiment, in the case that the supporting member 10 is formed of copper, an alkaline etching solution mainly containing ammonia, or the like is used as the etching solution. By this matter, the supporting member 10 can be selectively removed to the etching stop layer 12 and the resin layer 31.

Figure 11B:
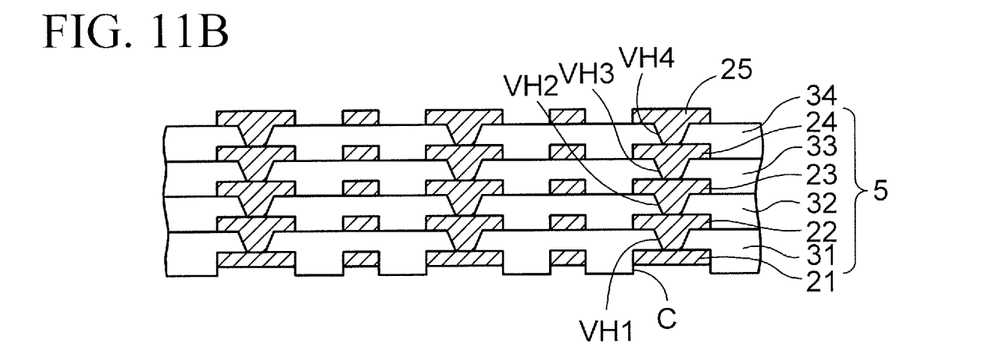

Further, as depicted in FIG. 11B, the etching stop layer 12 is removed by wet etching. Like the first embodiment, in the case that the etching stop layer 12 is formed of nickel, a mixed solution of aqueous hydrogen peroxide and nitric acid, or the like is used as the etching solution. By this matter, the etching stop layer 12 can be selectively removed to the wiring layer 21 (copper) and the resin layer 31.

In this way, the supporting member 10 and the etching stop layer 12 are removed from the structure in FIG. 10E, so that the build-up intermediate body 5 of the five layers is obtained.

The etching stop layer 12 is removed, by this matter, recesses C are formed in the lower face side of the resin layer 31 of the build-up intermediate body 5. It is in a state that the wiring layer 21 is arranged on the bottom face side of each recess C.

Figure 12A:
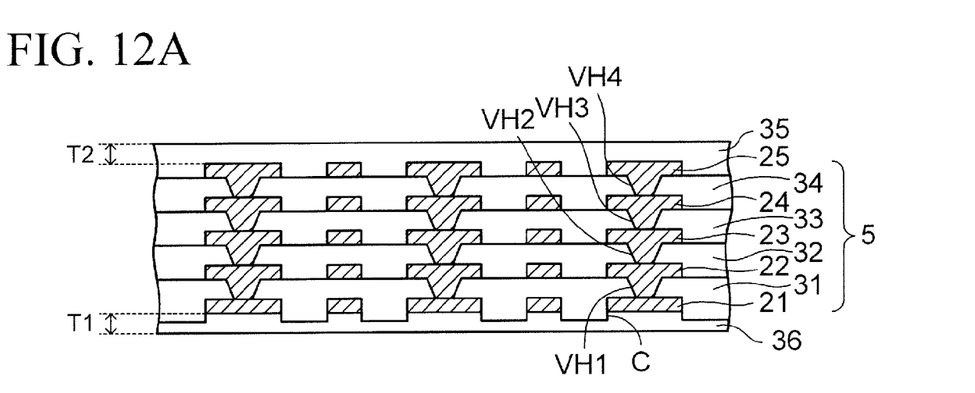
FIGS. 12A and 12B are cross-sectional views depicting the method of manufacturing a wiring substrate of the second embodiment (Part 3).

Then, as depicted in FIG. 12A, similarly to FIG. 6B of the first embodiment, the resin layer 35 and the resin layer 36 are formed on both face sides of the build-up intermediate body 5 in FIG. 11B. The recesses C in the lower face side of the resin layer 31 are filled with the resin layer 36, and the lower face of the resin layer 36 is formed in a flat state.

A thickness T1 from the lower face of the wiring layer 21 to the lower face of the resin layer 36 is set equal to a thickness T2 from the upper face of other wiring layers, i.e., the wiring layer 25, to the upper face of the resin layer 35.

After the build-up intermediate body 5 is formed, the resin layers which are arranged to oppose on and face both face sides of the build-up intermediate body 5 are formed so as to have the same thickness. By forming the resin layers of the same thickness on both face sides of the build-up intermediate body 5, the wiring substrate can be manufactured in a state that the warp of the substrate is suppressed to the minimum extent.

Figure 12B:
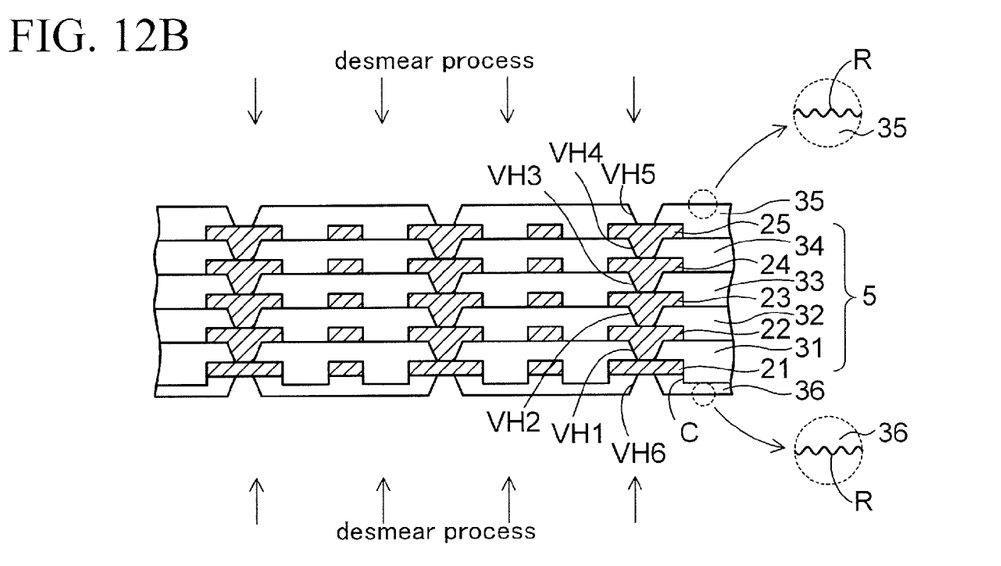

Then, as depicted in FIG. 12B, the resin layer 35 on the upper face side is processed by a laser, or the like to form via holes VH5 reaching the wiring layer 25. Moreover, similarly, the resin layer 36 on the lower face side is processed by a laser, or the like to form via holes VH6 reaching the wiring layer 21.

Like the first embodiment, each via hole VH6 is formed to have a reverse tapered shape whose diameter is set small gradually from the lower face of the resin layer 36 toward the thickness direction thereof. The via hole VH6 is formed to have the tapered shape reverse to the tapered shape of the via holes VH1-VH5.

Further, similarly to FIG. 7A of the first embodiment, desmear process is performed on both face sides. By this matter, the resin smears remaining on the bottoms of the via holes VH5 and VH6 are cleaned.

In this time, simultaneously, as depicted in the partially enlarged cross-sectional views in FIG. 12B, by the desmear process, the asperities are formed on the side face of each via hole VH5, VH6 and the each surface of the resin layer 35 and resin layer 36, thus, the each surface of the resin layer 35 and the resin layer 36 is made to the roughened face R.

As described above, also, in the second embodiment, the resin layer 36 having the roughened face R can be easily formed on also the surface of the build-up intermediate body 5 on the side from which the supporting member 10 and the etching stop layer 12 are removed.

Figure 13A:
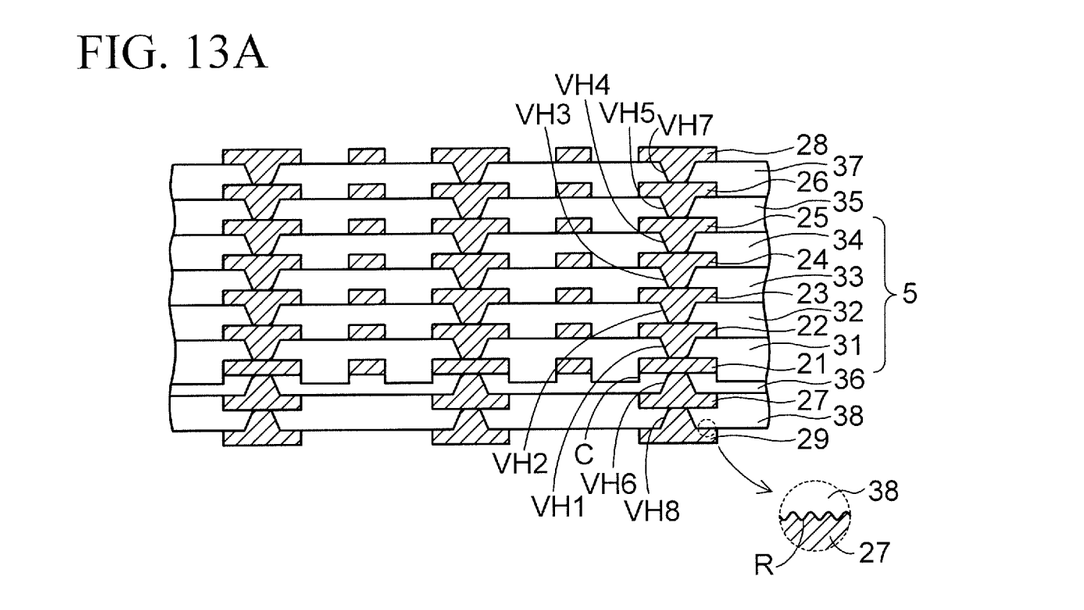
FIGS. 13A and 13B are cross-sectional views depicting the method of manufacturing a wiring substrate of the second embodiment (Part 4).

Then, as depicted in FIG. 13A, the steps in FIGS. 7B to 8A of the first embodiment are performed to stack the wiring layer 26 and the wiring layer 28 on the upper face side in FIG. 12B by a similar method. Moreover, the wiring layer 27 and the wiring layer 29 are stacked on the lower face side in FIG. 12B by a similar method.

As depicted in the partially enlarged cross-sectional view in FIG. 13A, like the first embodiment, each of the surfaces of the resin layers 36 and 38 formed on the surface of the build-up intermediate body 5 on the side from which the supporting member 10 and the etching stop layer 12 are removed, is the adequately roughened face R. For this reason, the fine wiring layer 27 and fine wiring layer 29 can be formed with good adhesion on also the surface of the build-up intermediate body 5 on the side from which the supporting member 10 and the etching stop layer 12 are removed.

Figure 13B:
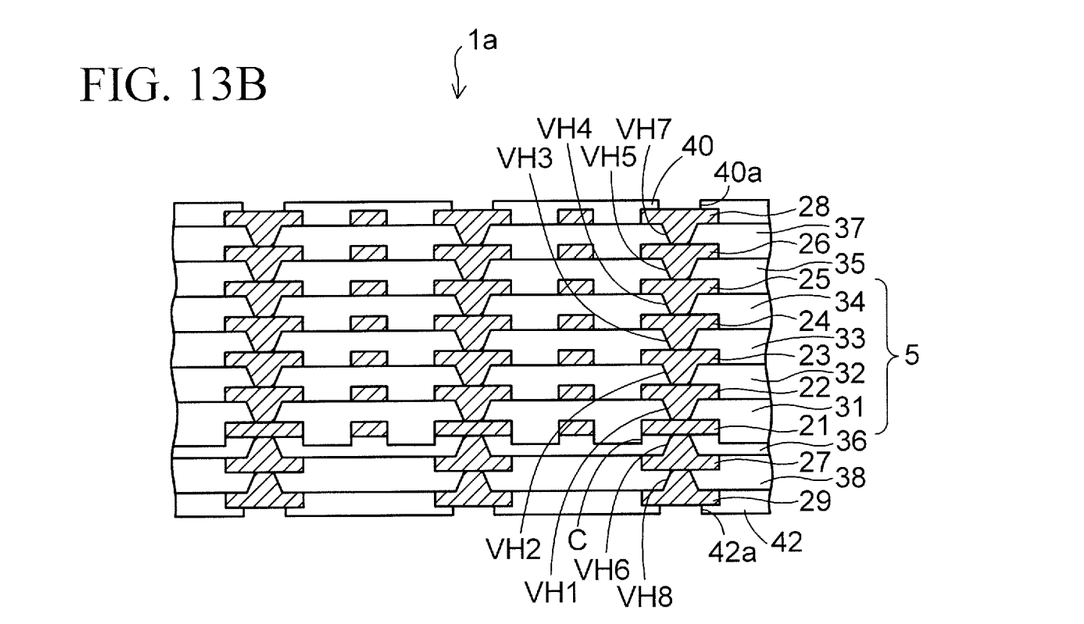

Then, as depicted in FIG. 13B, similarly to FIG. 8B of the first embodiment, on the upper face side, the solder resist 40 in which the opening portions 40a are provided on the connection parts of the wiring layer 28, is formed. Moreover, on the lower face side, the solder resist 42 in which the opening portions 42a are provided on connection parts of the wiring layer 29, is formed.

By the above steps, a wiring substrate 1a of the second embodiment is obtained.

The wiring substrate 1a of the second embodiment has substantially the same structure as the wiring substrate 1 of the first embodiment. In the second embodiment, the etching stop layer 12 is formed with the same pattern as the wiring layer 21. For this reason, the wiring layer 21 is arranged on the bottom side of each recess C in the resin layer 31, and it is in a state that the recess C is filled with the resin layer 36.

The method of manufacturing a wiring substrate of the second embodiment brings about a similar effect to that of the first embodiment.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a wiring substrate, comprising:
    forming an etching stop layer on a supporting member;
    forming a build-up intermediate body on the etching stop layer;
    wherein the build-up intermediate body is formed on the etching stop layer by alternately laminating a wiring layer and an insulating layer,
    wherein the build-up intermediate body are provided with an uppermost wiring, an uppermost insulating layer, a lowermost wiring layer and a lowermost insulating layer, and
    wherein the lowermost wiring layer and the lowermost insulating layer are contacted to the etching stop layer opposite to the uppermost wiring layer and the uppermost insulating layer,
    wherein the uppermost wiring layer is arranged uppermost among the wiring layer of the build-up intermediate body,
    wherein the uppermost insulating layer is arranged uppermost among the insulating layer of the intermediate body;
    removing the supporting member so as to expose the etching stop layer;
    removing the etching stop layer so as to expose the lowermost wiring layer;
    forming a first insulating layer on the uppermost insulating layer so as to cover the uppermost wiring layer, and forming a second insulating layer on the lowermost insulating layer so as to cover the lowermost wiring layer;
    forming a first via hole reaching the uppermost wiring layer in the first insulating layer, and forming a second via hole reaching the lowermost wiring layer in the second insulating layer;
    forming a roughened face to the first insulating layer and the second insulating layer; and
    forming a first wiring layer connected to the uppermost wiring layer through the first via in the first insulating layer, and forming a second wiring layer connected to the lowermost wiring layer through the second via hole in the second insulating layer.

2. The method of manufacturing a wiring substrate according to claim 1, wherein in the forming the etching stop layer, the etching stop layer is formed on an entire surface of the supporting member.

3. The method of manufacturing a wiring substrate according to claim 1, wherein in the forming the etching stop layer and in the forming a first wiring layer, the etching stop layer is formed with the same pattern as the first wiring layer.

4. The method of manufacturing a wiring substrate according to claim 1, wherein in the forming a roughened face to the first insulating layer and the second insulating layer, surface roughness of the exposed face of the first insulating layer and the second insulating layer is set within the same range as surface roughness of an upper face of the lowermost insulating layer.

5. The method of manufacturing a wiring substrate according to claim 1, wherein the forming a roughened face to the first insulating layer and the second insulating layer is performed by a desmear process.

6. The method of manufacturing a wiring substrate according to claim 1, wherein the second wiring layer is formed by a semi-additive method.

7. The method of manufacturing a wiring substrate according to claim 1, wherein the first via hole in the first insulating layer has a tapered shape whose diameter is set small gradually from the surface of the first insulating layer toward the uppermost first wiring layer, and
    the second via hole in the second insulating layer arranged on a lower face side of the lowermost wiring layer has a tapered shape reverse to the shape of the first via hole in the first insulating layer.

8. The method of manufacturing a wiring substrate according to claim 1, wherein the supporting member and the first wiring layer formed of copper, and the etching stop layer is formed of nickel.

9. The method of manufacturing a wiring substrate according to claim 1, wherein a thickness from a lower face of the lowermost wiring layer to a lower face of the second insulating layer is the same as a thickness) from an upper face of the uppermost wiring layer to an upper face of the first insulating layer.

* * * * *